(12) United States Patent
Zhu

(10) Patent No.: US 7,612,270 B1
(45) Date of Patent: Nov. 3, 2009

(54) NANOELECTROMECHANICAL DIGITAL INVERTER

(75) Inventor: Huilong Zhu, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 15 days.

(21) Appl. No.: 12/099,989

(22) Filed: Apr. 9, 2008

(51) Int. Cl.
 H03K 19/20 (2006.01)
(52) U.S. Cl. .................. 977/724; 977/742; 326/104
(58) Field of Classification Search ............... None
 See application file for complete search history.

(56) References Cited

U.S. PATENT DOCUMENTS

| | | | |
|---|---|---|---|
| 6,348,295 B1 | 2/2002 | Griffith et al. | |
| 6,472,705 B1 | 10/2002 | Bethune et al. | |
| 6,574,130 B2 | 6/2003 | Segal et al. | |
| 6,635,506 B2 | 10/2003 | Volant et al. | |
| 6,643,165 B2 | 11/2003 | Segal et al. | |
| 6,664,027 B2 | 12/2003 | Griffith et al. | |
| 6,706,402 B2 | 3/2004 | Rueckes et al. | |
| 6,750,471 B2 | 6/2004 | Bethune et al. | |
| 6,784,028 B2 | 8/2004 | Rueckes et al. | |
| 6,835,591 B2 | 12/2004 | Rueckes et al. | |
| 6,836,424 B2 | 12/2004 | Segal et al. | |
| 6,887,450 B2 | 5/2005 | Chen et al. | |
| 6,911,682 B2 | 6/2005 | Rueckes et al. | |
| 6,919,592 B2 | 7/2005 | Segal et al. | |
| 6,924,538 B2 | 8/2005 | Jaiprakash et al. | |
| 6,942,921 B2 | 9/2005 | Rueckes et al. | |
| 6,944,054 B2 | 9/2005 | Rueckes et al. | |
| 6,979,590 B2 | 12/2005 | Rueckes et al. | |
| 6,982,903 B2 | 1/2006 | Bertin et al. | |
| 6,990,009 B2 * | 1/2006 | Bertin et al. | ............... 365/151 |
| 6,995,046 B2 | 2/2006 | Rueckes et al. | |
| 2007/0102747 A1 * | 5/2007 | Chen et al. | ............... 257/314 |

OTHER PUBLICATIONS

IBM Researchers Build World's First Single-Molecule Computer Circuit Aug. 27, 2001 http://domino.research.ibm.com/Comm/pr.nsf/pages/news.20010827_logiccircuit.html.*
Xiaolei Liu, Chenglung Lee, Chongwu Zhou; Carbon nanotube field-effect inverters Applied Physics Letters: vol. 79 No. 20 Nov. 12, 2001 http://nanolab.usc.edu/PDF%5CAPL79-3329.pdf.*
J.E. Jang et al., Nanoelectromechanical DRAM for ultra-large-scale integration (ULSI), 0-7803-9269-8/05, copr. 2005, IEEE.
J.W. Ward et al., A Non-volatile Nanoelectromechanical Memor Element Utilizing a Fabric of Carbon Nanotubes, 0-7803-8726-0/04, copr. 2004, IEEE.
T. Rueckes et al., Carbon Nanotube-Based Nonvolatile Random Access Memory for Molecular Computing, Science, Jul. 7, 2000, vol. 289, pp. 94-97.

* cited by examiner

Primary Examiner—Rexford N Barnie
Assistant Examiner—Dylan White
(74) Attorney, Agent, or Firm—Yuanmin Cai; Howard Cohn

(57) ABSTRACT

A digital inverter formed by three carbon nanotubes (CNTs) extending vertically from a substrate, one CNT functioning as first source (S1) and having a first logic signal applied to it, another CNT functioning as second source (S2) and having a second logic signal applied to it, a third CNT functioning as gate (G), and disposed between the two sources (S1, S2). A drain (D) contact is associated with the gate (G). A logic signal applied to the gate (G) causes one or the other of the sources (S1, S2) to deflect, contacting the drain (D) and transferring its logic signal thereto—such as logic "0" on the gate resulting in logic "1" (from one of the sources) being transferred to the drain (D), and logic "1" on the gate resulting in logic "0" (from the other of the sources) being transferred to the drain (D).

20 Claims, 15 Drawing Sheets

NANOELECTROMECHANICAL DIGITAL INVERTER

FIELD OF THE INVENTION

The present invention relates to devices for use in semiconductor integrated circuits (ICs) and, more particularly relates to digital inverters.

BACKGROUND OF THE INVENTION

A digital inverter (also referred to as a "NOT" gate) is considered to be a basic building block for all digital electronics. For example, memory (1 bit register) may be built as a latch by feeding the output of two serial inverters together. Multiplexers, decoders, state machines, and other sophisticated digital devices all rely on the basic inverter.

In digital logic, an inverter is a logic gate which inverts the digital signal driven on its input. It is also called NOT gate. The truth table of the gate is as follows:

| Input | Output |
|-------|--------|
| 0     | 1      |
| 1     | 0      |

This represents perfect switching behavior, which is the defining assumption in digital electronics. In practice, actual devices have electrical characteristics that must be carefully considered when designing inverters.

A digital inverter circuit outputs a voltage representing the opposite logic-level as its input. Digital electronics are circuits that operate at fixed voltage levels corresponding to a logical 0 or 1. An inverter circuit serves as the basic logic gate to swap between those two voltage levels. Implementation determines the actual voltage, but common levels include (0, +5V) for TTL (transistor-transistor logic) circuits.

A CMOS Inverter

FIG. 1 shows a simple CMOS digital inverter comprising a P-type transistor Q1 and an N-type transistor Q2. The gates of the two transistors are connected together. The source (S1) of transistor Q1 is connected to supply voltage VCC, the source (S2) of transistor Q2 is connected to ground GND. The drains (D1, D2) of the two transistors Q1 and Q2 are connected together.

An input node is connected to the gates (G1, G2) of the two transistors, and an output node is connected to the drains (D1, D2) of the two transistors Q1 and Q2. Since the two drains D1 and D2 are connected with one another, they may simply be referred to as the drain "D" of the inverter circuit. Similarly, since the two gates G1 and G2 are connected with one another, they may simply be referred to as the gate "G" of the inverter circuit. This results in the following terminology for an inverter circuit:

S1, which is a voltage (such as Vcc) representing one of the two binary logic levels S2, which is a voltage (such as Gnd) representing the other of the binary logic levels G, which is the input receiving a voltage to be inverted D, which is the output providing the inverse of the input voltage If the input voltage (G) is '1' (Vcc) the P-type transistor Q1 is non-conducting, but the N-type transistor Q2 is conducting and provides a path from GND to the output Y. The output level (D) therefore is '0'. On the other hand, if the input level (G) is '0', the P-type transistor Q1 is conducting and provides a path from VCC to the output Y, so that the output level (D) is '1', while the N-type transistor Q2 is blocked.

Nanotubes

Carbon nanotubes (CNTs) are allotropes of carbon. (An allotrope is one or more forms of an elementary substance, such as carbon. Diamond and graphite are perhaps the best known allotropes of carbon.)

A single-walled carbon nanotube (SWNT) is a one-atom thick sheet of graphite (called graphene) rolled up into a seamless cylinder with diameter on the order of a nanometer. This results in a nanostructure where the length-to-diameter ratio exceeds 1,000,000. Such cylindrical carbon molecules have novel properties that make them potentially useful in many applications in nanotechnology, electronics, optics and other fields of materials science. They exhibit extraordinary strength and unique electrical properties, and are efficient conductors of heat. Inorganic nanotubes have also been synthesized.

Nanotubes are members of the fullerene structural family, which also includes buckyballs. Whereas buckyballs are spherical in shape, a nanotube is cylindrical, with at least one end typically capped with a hemisphere of the buckyball structure. Their name is derived from their size, since the diameter of a nanotube is in the order of a few nanometers (approximately 1/50,000th of the width of a human hair), while they can be up to several millimeters in length. Nanotubes are categorized as single-walled nanotubes (SWNTs) and multi-walled nanotubes (MWNTs).

The nature of the bonding of a nanotube is described by applied quantum chemistry, specifically, orbital hybridization. The chemical bonding of nanotubes are composed entirely of sp2 bonds, similar to those of graphite. This bonding structure, which is stronger than the sp3 bonds found in diamond, provides the molecules with their unique strength. Nanotubes naturally align themselves into "ropes" held together by Van der Waals forces. Under high pressure, nanotubes can merge together, trading some $sp^2$ bonds for $sp^3$ bonds, giving great possibility for producing strong, unlimited-length wires through high-pressure nanotube linking.

The article entitled "A Non-volatile Nanoelectromechanical Memory element Utilizing a Fabric of Carbon Nanotubes, by Ward et al.", incorporated by reference herein, discloses manufacturability of electronic devices based on carbon nanotubes (CNT) generally depends on the ability to manipulate and control individual structures at the molecular level. A technique has been developed to overcome this hurdle, allowing CNT-based nano-electro-mechanical devices to be fabricated directly on existing production CMOS fabrication lines. A CMOS-compatible fabrication process for these devices has been developed and demonstrated which is free from metallic or material contaminants and particulates. Because these nonvolatile memory elements are created in an all thin-film process, they can be monolithically integrated directly within existing CMOS circuitry to facilitate addressing and readout. Design considerations and preliminary device switching characteristics are presented.

The article entitled "Carbon Nanotube-Based Nonvolatile Random Access Memory for Molecular Computing, Rueckes et al., Science, 7 Jul. 2000, vol 289, pages 94-97, incorporated by reference herein, discloses a concept for molecular electronics exploiting carbon nanotubes as both molecular device elements and molecular wires for reading and writing information.

Electrostatic Attraction

Electrostatics is the branch of science that deals with the phenomena arising from what seem to be stationary electric charges. This includes phenomena as simple as the attraction of plastic wrap to your hand after you remove it from a package to apparently spontaneous explosion of grain silos, to damage of electronic components during manufacturing, to the operation of photocopiers. Electrostatics typically involves the buildup of charge on the surface of objects due to contact with other surfaces. Although charge exchange happens whenever any two surfaces contact and separate, the effects of charge exchange are usually only noticed when at least one of the surfaces has a high resistance to electrical flow. This is because the charges that transfer to or from the highly resistive surface are more or less trapped there for a long enough time for their effects to be observed. These charges then remain on the object until they either bleed off to ground or are quickly neutralized by a discharge: e.g., the familiar phenomenon of a static 'shock' is caused by the neutralization of charge built up in the body from contact with nonconductive surfaces. Generally, objects in close proximity with one another and having opposite charges on them will attract each other.

The article entitled "Nanoelectromechanical DRAM for ultra-large-scale integration (ULSI)", Jang et al., 0-7803-9269-8/05, copr. 2005, IEEE, incorporated by reference herein, describes a Nanoelectromechanical (NEM) device for dynamic random access memory (DRAM). A vertical nanotube structure is employed to form the electromechanical switch and capacitor structure. The mechanical movement of the nanotube defines 'On' and 'OFF' states and the electrical signals which result lead to charge storage in a vertical capacitor structure as in a traditional DRAM. The vertical structure contributes greatly to a decrease in cell dimension. The main concept of the NEM switch and capacitor can be applied to other memory devices as well. As disclosed therein:

> MWCNTs were vertically grown on three Nb metal electrodes using a C2H2 and NH3 gas mixture, using direct current plasma enhanced chemical vapor deposition (DC-PECVD). A "source" MWCNT is electrically connected to ground, acting as a negative electrode. Positive electrostatic charge builds up n the "drain" MWCNT and the gate electrodes when connected to positive voltage supplies. The gate pushes the drain MWCNT towards the source MWCNT due to electrostatic forces, and the drain MWCNT makes contact to the source MWCNT.

RELATED PATENTS

U.S. Pat. No. 6,635,506, incorporated by reference herein, discloses method of fabricating micro-electromechanical switches on CMOS compatible substrates. A method of fabricating micro-electromechanical switches (MEMS) integrated with conventional semiconductor interconnect levels, using compatible processes and materials is described. The method is based upon fabricating a capacitive switch that is easily modified to produce various configurations for contact switching and any number of metal-dielectric-metal switches. The process starts with a copper damascene interconnect layer, made of metal conductors inlaid in a dielectric. All or portions of the copper interconnects are recessed to a degree sufficient to provide a capacitive air gap when the switch is in the closed state, as well as provide space for a protective layer of, e.g., Ta/TaN. The metal structures defined within the area specified for the switch act as actuator electrodes to pull down the movable beam and provide one or more paths for the switched signal to traverse. The advantage of an air gap is that air is not subject to charge storage or trapping that can cause reliability and voltage drift problems. Instead of recessing the electrodes to provide a gap, one may just add dielectric on or around the electrode. The next layer is another dielectric layer which is deposited to the desired thickness of the gap formed between the lower electrodes and the moveable beam that forms the switching device. Vias are fabricated through this dielectric to provide connections between the metal interconnect layer and the next metal layer which will also contain the switchable beam. The via layer is then patterned and etched to provide a cavity area which contains the lower activation electrodes as well as the signal paths. The cavity is then back-filled with a sacrificial release material. This release material is then planarized with the top of the dielectric, thereby providing a planar surface upon which the beam layer is constructed.

U.S. Pat. No. 6,911,682, incorporated by reference herein, discloses electromechanical three-trace junction devices. Three trace electromechanical circuits and methods of using same are described. A circuit includes first and second electrically conductive elements with a nanotube ribbon (or other electromechanical elements) disposed therebetween. The nanotube ribbon is movable toward at least one of the first and second electrically conductive elements in response to electrical stimulus applied to at least one of the first and second electrically conductive elements and the nanotube ribbon. Such circuits may be formed into arrays of cells. The upper and lower electrically conductive traces may be aligned or unaligned vertically. An electrical stimulus may be applied to at least one of the first and second electrically conductive elements and the nanotube ribbon to move the nanotube ribbon toward at least one of the first and second electrically conductive elements. Electrical signals from at least one the first and second electrically conductive elements and the nanotube ribbon may be sensed to determine the electrical state of the cell. The states may be assigned in a variety of ways. For example, if the ribbon is moved toward the first electrically conductive element, the electrical state is a first state; if the ribbon is moved toward the second electrically conductive element, the electrical state is a second state; and if the ribbon is between the first and second electrically conductive elements, the electrical state is a third state. The first, second, and third states each corresponds to a different information encoding. Or, electrical stimulus may be applied to both the first and second electrically conductive elements so that the first and second electrically conductive elements both cause the movement of the nanotube ribbon. Or, the first and second electrically conductive elements are used in a fault tolerant manner.

GLOSSARY

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

| | |
|---|---|
| anisotropic | literally, one directional. An example of an anisotropic process is sunbathing. Only surfaces of the body exposed to (facing in the direction of) the sun become tanned. Anisotropic means "not the same in all directions" or "not isotropic". See isotropic. |
| CMOS | short for complementary metal oxide semiconductor. CMOS consists of n-channel and p-channel MOS transistors. Due to very low power consumption and dissipation as well as minimization of the current in "off" state, CMOS is a very effective device configuration for implementation of digital functions. CMOS is a key device in state-of-the-art silicon microelectronics. CMOS Inverter: A pair of two complementary transistors (a p-channel and an n-channel) with the source of the n-channel transistor connected to the drain of the p-channel transistor, and the gates connected to each other. The output (drain of the p-channel transistor) is high whenever the input (gate) is low and the other way round. The CMOS inverter is the basic building block of CMOS digital circuits. NMOS: n-channel CMOS. PMOS: p-channel CMOS. |
| CMP | short for chemical-mechanical polishing. CMP is a process, using both chemicals and abrasives, comparable to lapping (analogous to sanding), for removing material from a built up structure. For example, after depositing and etching a number of elements, the top surface of the resulting structure may very uneven, needing to be smoothed (or levelled) out, prior to performing a subsequent process step. Generally, CMP will level out the high spots, leaving a relatively smooth planar surface. |
| CVD | short for chemical vapor deposition. CVD is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. CVD is used to deposit materials in various forms, including: monocrystalline, polyciystalline, amorphous, and epitaxial. These materials include: silicon, oxide, nitride and metals, such as are commonly used in semiconductor fabrication. |
| deposition | Deposition generally refers to the process of applying a material over another material (or the substrate). Chemical vapor deposition (CVD) is a common technique for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate. |
| etching | etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. |
| | Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. |
| FET | short for field effect transistor. The FET is a transistor that relies on an electric field to control the shape and hence the conductivity of a "channel" in a semiconductor material. FETs are sometimes used as voltage-controlled resistors. The terminals of FETs are designated source (S), drain (D) and gate (G). Corresponding voltages applied to these terminals may be referred to as Vs, Vd, Vg, respectively. Substrate voltage may also play a role in FET operation. |
| inverter | In digital logic, an inverter is a logic gate which inverts the digital signal driven, on its input. It is also called NOT gate. An inverter has an input (sometimes labeled "G") and an output (sometimes labeled "D"). A logic "1" on the input results in a logic "0" on the output. Conversely, a logic "0" on the input results in a logic "1" on the output. |
| isotropic | literally, identical in all directions. An example of an isotropic process is dissolving a tablet in water. All exposed surfaces of the tablet are uniformly acted upon. (see "anisotropic") |
| lithography | In lithography (or "photolithography"), a radiation sensitive "resist" coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example. |
| mask | The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask". |
| nitride | commonly used to refer to silicon nitride (chemical formula $Si_3N_4$). A dielectric material commonly used in integrated circuit manufacturing. Forms an excellent mask (barrier) against oxidation of silicon (Si). Nitride is commonly used as a hard mask (HM). |
| oxide | commonly used to refer to silicon dioxide ($SiO_2$). Also known as silica. $SiO_2$ is the most common insulator in semiconductor device technology, particularly in silicon MOS/CMOS where it is used as a gate dielectric (gate oxide); high quality films are obtained by thermal oxidation of silicon. Thermal $SiO_2$ forms a smooth, low-defect interface with Si, and can be also readily deposited by CVD. Oxide may also be used to fill STI trenches, form spacer structures, and as an inter-level dielectric, for example. |
| plasma etching | Plasma etching refers to dry etching in which semiconductor wafer is immersed in plasma containing etching species; chemical etching reaction is taking place at the same rate in any direction, i.e. etching is isotropic; can be very selective; used in those applications in which directionality (anisotropy) of etching in not required, e.g. in resist stripping. |
| poly | short for polycrystalline silicon (Si). Heavily doped poly Si is commonly used as a gate contact in silicon MOS and CMOS devices; |

-continued

| | |
|---|---|
| RIE | short for Reactive Ion Etching. RIE is a variation of plasma etching in which during etching, the semiconductor wafer is placed on an RF powered electrode. The plasma is generated under low pressure (vacuum) by an electromagnetic field. It uses chemically reactive plasma to remove material deposited on wafers. High-energy ions from the plasma attack the wafer surface and react with it. The wafer takes on potential which accelerates etching species extracted from plasma toward the etched surface. A chemical etching reaction is preferentially taking place in the direction normal to the surface in other words, etching is more anisotropic than in plasma etching but is less selective. RIE typically leaves the etched surface damaged. RIE is the most common etching mode in semiconductor manufacturing. |
| V | short for voltage. Different voltages may be applied to different parts of a transistor or memory cell to control its operation, such as:<br>Vb  short for bulk (or substrate) voltage<br>Vd  short for drain voltage<br>Vg  short for gate voltage<br>Vs  short for source voltage |

SUMMARY OF THE INVENTION

According to embodiments of the invention, generally, structure and method are disclosed to make a nanoelectromechanical (NEM) inverter that includes vertical NEM structures. The structures may be elongated tubes (cylindrical), and may be single wall or multi-wall.

Generally, there are three NEM structures, close together. In response to an input ("gate") voltage, one or the other of two NEMs functioning as "sources" (S1 and S2) deflects to selectively contact a third NEM functioning as "drain" (D). In this manner, the voltages (representing logic states "0" and "1") on the two "source" NEMs can selectively be applied to the "drain" NEM, and this can be done in a manner that the voltage applied to the "drain" NEM is the opposite (or inverse, as in "inverter") of the voltage (representing logic states "1" and "0") on the "gate".

According to an embodiment of the invention, a digital inverter includes: a first carbon nanotube (CNT) extending from the substrate, and functioning as a first source (S1) for the inverter; a second carbon nanotube (CNT) extending from the substrate, and functioning as a second source (S1) for the inverter; a third carbon nanotube (CNT) extending from the substrate, and functioning as an input (G) of the inverter; and a conductive structure disposed on the third CNT, and functioning as the output (D) of the inverter. A conductive contact structure may be disposed near a top end of the third CNT (G).

The first CNT may be disposed a distance from the third CNT; and the second CNT may be disposed at substantially the same distance from the third CNT. The first CNT may be disposed to one side of the third CNT; and the second CNT may be disposed on an opposite side of the third CNT.

The first, second and third CNTs may extend substantially vertically from the substrate. The first, second and third CNTs may extend from corresponding first, second and third electrodes disposed on a surface of the substrate. The first, second and third CNTs may extend from corresponding first, second and third catalyst structures disposed on the first, second and third electrodes.

The first, second and third CNTs may have a height "H" of 20-100 nm. The first and second CNTs may be sufficiently long to allow them to bend, while the third CNT (G) is sufficiently stiff to substantially prevent it from bending.

The first and second CNTs may be selectively caused to bend and contact the third CNT (G). In a first state, the first CNT may deflect towards the third CNT and physically contact the third CNT. In a second state, the second CNT may deflect towards the third CNT and physically contacts the third CNT.

According to an embodiment of the invention, a method of inverting a digital signal comprises: providing a nanoelectromechanical inverter comprising three elongate carbon nanotubes (CNTs) extending from a surface of a substrate; using a first one of the CNTs as a first source (S1) for the inverter; using a second one of the CNTs as a second source (S2) for the inverter; using a third one of the CNTs as a gate (G) for the inverter; and providing a drain (D) for the converter. A first digital logic signal may be applied to the first source (S1); a second digital logic signal may be applied to the second source (S2); and a third digital logic signal output by the drain (D) may be the inverse of a fourth digital logic signal applied to the gate (G).

The application of the first logic signal applied to the gate (G) may cause one of the first and second source CNTs to deflect and contact the third CNT; and the application of the second logic signal applied to the gate (G) may cause another of the first and second the source CNTs to deflect and contact the third CNT.

The first and the second logic signals may have a voltage difference ranging from 0.5 to 15 volts.

In this manner, a digital inverter may be formed (and operated) by three carbon nanotubes (CNTs) extending vertically from a substrate, one CNT functioning as first source (S1) and having a first logic signal applied to it, another CNT functioning as second source (S2) and having a second logic signal applied to it, a third CNT functioning as gate (G), and disposed between the two sources (S1, S2). A drain (D) contact is associated with the gate (G). A digital logic signal applied to the gate (G) causes one or the other of the sources (S1, S2) to deflect, contacting the drain (D) and transferring its digital logic signal thereto—such as logic "0" on the gate resulting in logic "1" (from one of the sources) being transferred to the drain (D), and logic "1" on the gate resulting in logic "0" (from the other of the sources) being transferred to the drain (D).

The vertical NEM inverter disclosed herein may be implemented in a small area, saving both active and isolation areas when contrasted with the typical CMOS inverter which comprises two transistors (FETs).

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that the edges may not be so straight, and the intersections may be rounded, due to the nature of the processes (such as etching) used to form the various elements of the semiconductor devices.

Figure 1:
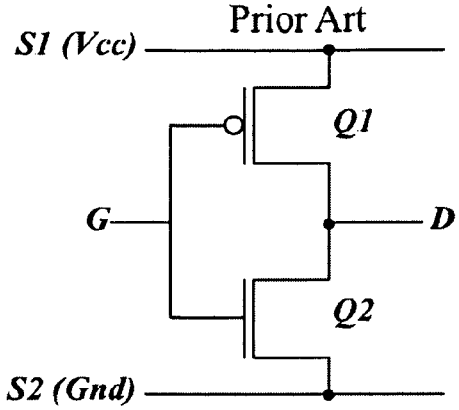
Figure 2:
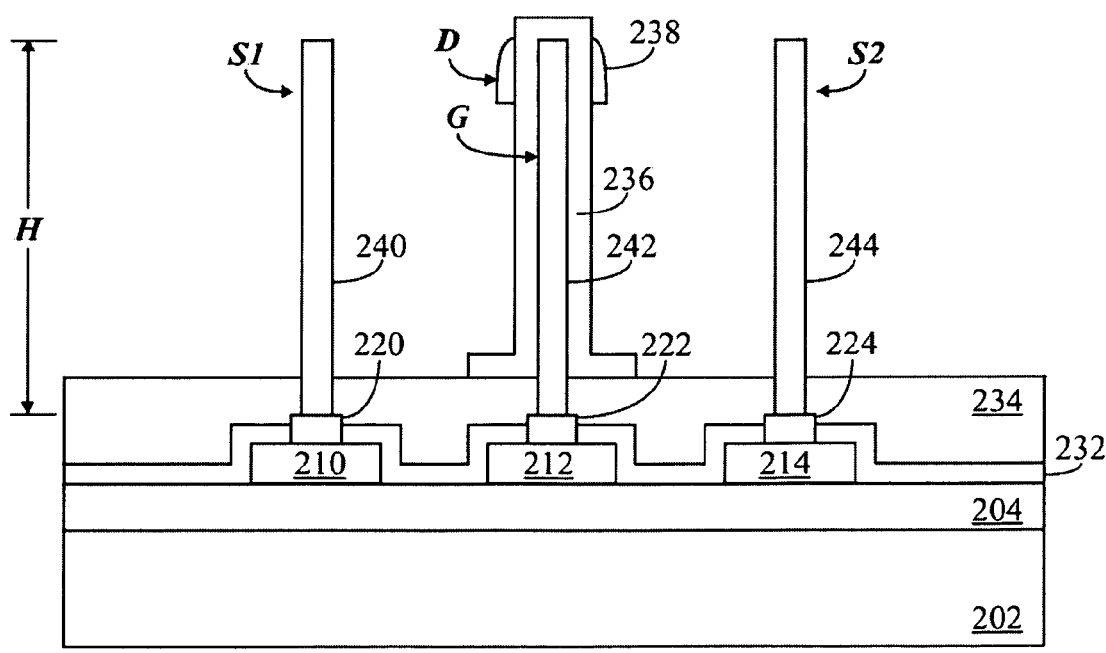

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

FIG. 1 is a schematic diagram of a CMOS inverter of the prior art.

FIG. 2 is a cross-sectional view of a nanoelectromechanical (NEM) inverter, according to an embodiment of the invention.

Figure 3A:
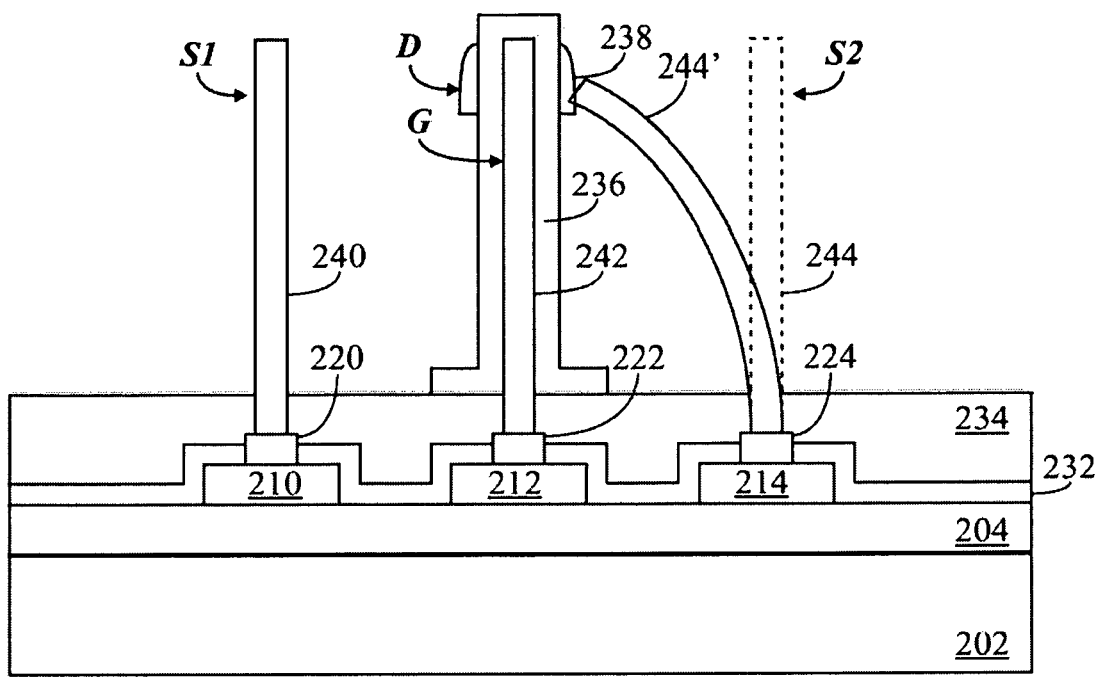

FIG. 3A is a cross-sectional view of the NEM of FIG. 2, in one state.

Figure 3B:
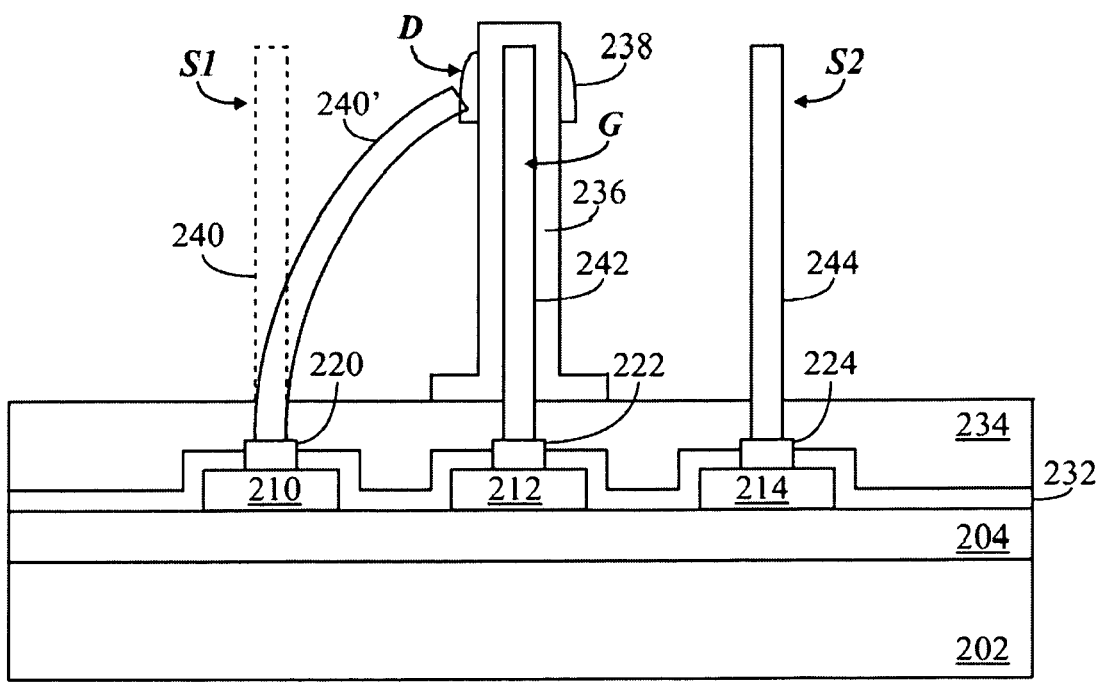

FIG. 3B is a cross-sectional view of the NEM of FIG. 2, in another state.

Figure 4A:
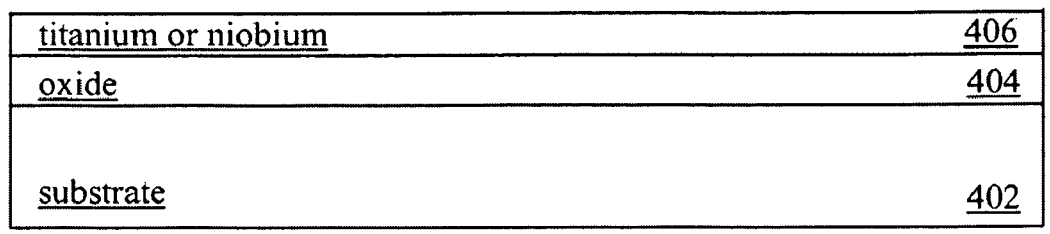

FIGS. 4A-4AA are cross-sectional views (A, C, D, F, G, I, K, L, M, N, P, R, T, V, W, X, Y) and top views (B, E, H, J, O, Q, S, U, Z, AA) of a sequence of steps for forming the NEM shown in FIG. 2.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H2O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

An Exemplary NEM Structure

FIG. 2 illustrates a nanoelectromechanical (NEM) structure (device) 200 capable of functioning as a digital inverter, according to an embodiment of the invention.

An oxide layer 204 is disposed on a semiconductor substrate 202. The substrate 202 may be a conventional silicon substrate. The oxide layer 204 may be a pad oxide layer, having a thickness of approximately 200-500 nm.

Three electrodes 210, 212 and 214 are disposed on the oxide layer 204. Each electrode may be rectangular or circular (when viewed from the top), having a cross-dimension or diameter of approximately 10-100 nm. The three electrodes may be substantially collinear (when viewed from the top), and may be spaced approximately 20-200 nm apart from one another. The electrodes may have a thickness of approximately 50-100 nm.

Three nickel (Ni) catalyst structures 220, 222 and 224 are disposed on the electrodes 210, 212, 214, respectively. Each Ni structure may be square, or circular having a diameter of approximately 10-100 nm, and each Ni structure may have a thickness of approximately 5-10 nm. The Ni structures serve as a catalyst for formation of carbon nanotubes (CNTs).

Three carbon nanotubes (CNTs) 240, 242 and 244 are disposed (formed, grown) on the Ni structures 220, 222 and 224, respectively. Each CNT has a diameter substantially equal to the diameter of the respective Ni structure, and the CNTs may have a height "H" of approximately 20-100 nm (200-1000 Å). Generally, if the CNTs are too short they may have trouble bending and if they are too long, they may not be stable (note, however, that the middle CNT is not intended to bend).

The outer CNTs 240 and 244 are sufficiently long to allow them to bend (flex), and the center CNT 242 is sufficiently stiff to substantially prevent it from bending. In this manner, the outer CNTs 240 and 244 may selectively be caused to bend and contact the center CNT 242.

An oxide layer 232 is disposed atop the oxide layer 204, and extends over the electrodes 210, 212, 214 except where the Ni structures 220, 222, 224 are located. The oxide layer may have a thickness of approximately 5-10 nm.

A nitride layer 234 is disposed atop the oxide layer 232, and helps to support the CNTs 240, 242, 244, at their bottom ends.

A nitride insulating layer 236 covers the central CNT 242, and a conductive (such as chromium) structure 238 is disposed near the top of the central CNT, to function as a contact for the other two CNTs 240 and 244, as described in greater detail hereinbelow. The nitride layer 236 may have a thickness of approximately 20-50 nm.

Hence, there are two CNTs 240 and 244 disposed at a distance, such as 80 nm, from a central CNT 242, and may (or may not) be located on opposite sides of the central CNT 242. Whereas the two CNTs 240 and 244 are capable of flexing, the central CNT 242 is relatively rigid (less flexible).

Use as an Inverter

In use as an inverter, the following elements may serve the following purposes:
the electrode 210 and CNT 240 function as a first source "S1"
the electrode 212 and CNT 242 function as the gate "G"
the electrode 214 and CNT 244 function as a second source "S2"
the chromium layer 238 functions as the drain "D"

It should be understood that the terms source (S), drain (D) and gate (G) are used only by way of analogy, and that the inverter structure 200 is not an FET (or a pair of CMOS FETs, such as was shown in FIG. 1). The NEM inverter is an electromechanical device.

The CNTs 240, 242 and 244 are NEM structures, and the terms "CNT" and "NEM" may be used interchangeably herein to refer to these elements. The CNTs may be single wall or multi-wall.

Generally, the central NEM structures 242 functions as the "gate" G, or input of the inverter, and the chromium layer (structure) 238 functions as the "drain" D of the inverter. Each of the two other NEM structures 240 and 244 function as "sources" S1 and S2 of the inverter and are arranged close to the drain 242. It is not necessary that the sources 240 and 244 are on opposite sides of the drain 242 (hence, it is not critical that the three NEM structures are collinear), only that they may each deflect independently to contact the drain, and the two source NEMS 240 and 244 should be equidistant from the drain NEM 242. Deflection of the sources 240 and 244 is controlled by the "gate" electrode.

FIGS. 3A and 3B illustrate the digital inverter 200 in two "states". In both states, the electrode 210 (S1) is set to a first voltage such as ground which represents logic "0", and the electrode 214 (S2) is set to a second voltage such as Vcc which represents logic "1".

In a first state, when the electrode 212 (G1 the input of the digital inverter) is at logic "0", the CNT 244' deflects towards the center CNT 242 (which serves as both gate and drain), due to electrostatic attraction, and physically contacts the contact structure 238, thereby causing the drain to have the second voltage (digital logic signal) which represents logic "1". (The CNT 244 in its un-deflected state is shown in dashed lines.) (In this state, the second CNT does not deflect, and is isolated from the third CNT.) In this first state, the input is "0", and the output is "1". In other words, if G=0, then D=1.

In a second state, when the electrode 212 (G, the input of the digital inverter) is at logic "1", the CNT 240' deflects towards the center CNT 242, due to electrostatic attraction, and physically contacts the contact structure 238, thereby causing the drain to have the first voltage (digital logic signal) which represents logic "0". (The CNT 240 in its un-deflected state is shown in dashed lines.) In this second state, the input is "1", and the output is "0". In other words, if G=1, then D=0. (In this state, the first CNT does not deflect, and is isolated from the third CNT.) This is how the device disclosed herein "inverts" a digital signal—a digital logic "0" input signal being output as a digital logic "1" signal, and a digital logic "1" input signal being output as a digital logic "0" output signal.

The voltage differences between the outer CNTs 240 and 244, which function as inverter "sources" and the center CNT 242, which functions as inverter "gate", accounts for the electrical attraction between the sources and the gate. One can define the voltage difference between states "1" and "0" ranges from 0.5 to 15 volts. Or, they can be opposite polarity voltages, such as +5 volts and −5 volts.

An Exemplary Process Flow

Figure 4B:
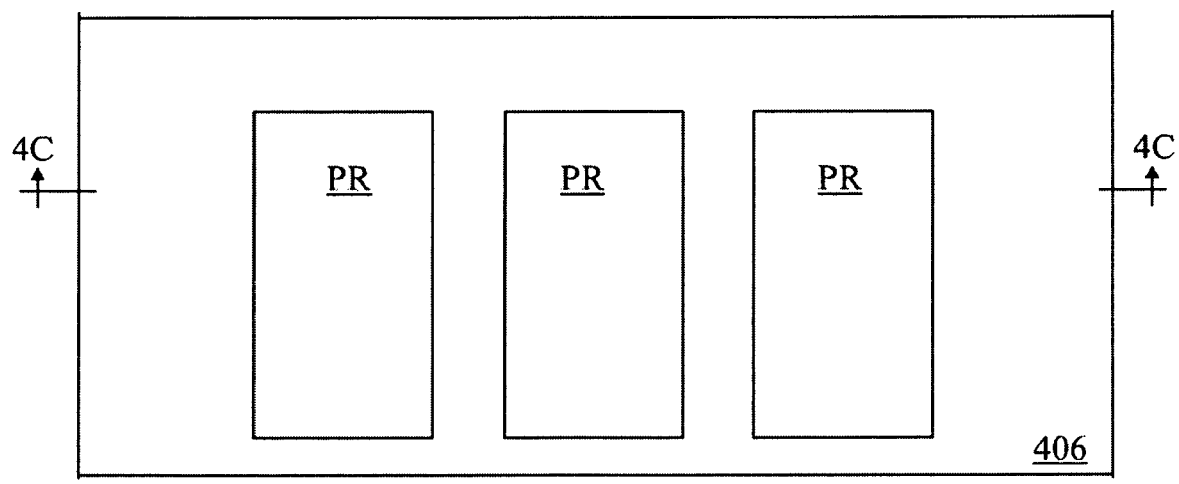
Figure 4C:
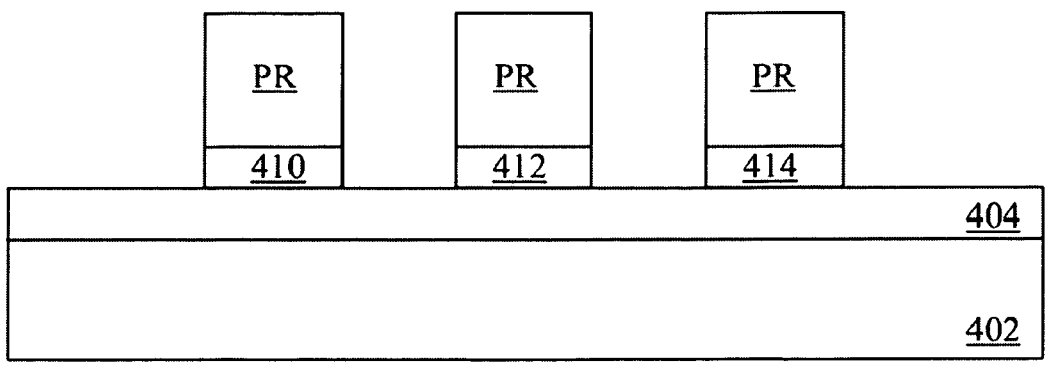
Figure 4D:
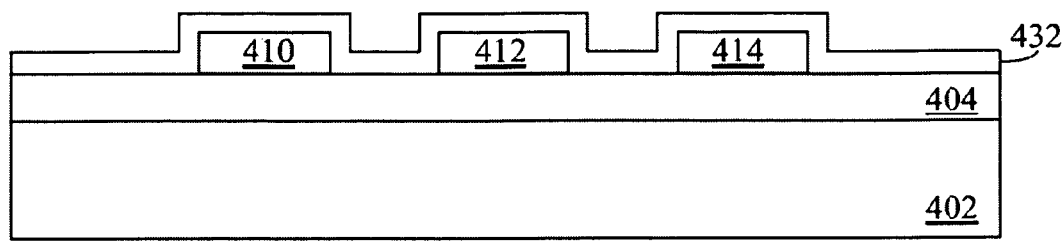
Figure 4E:
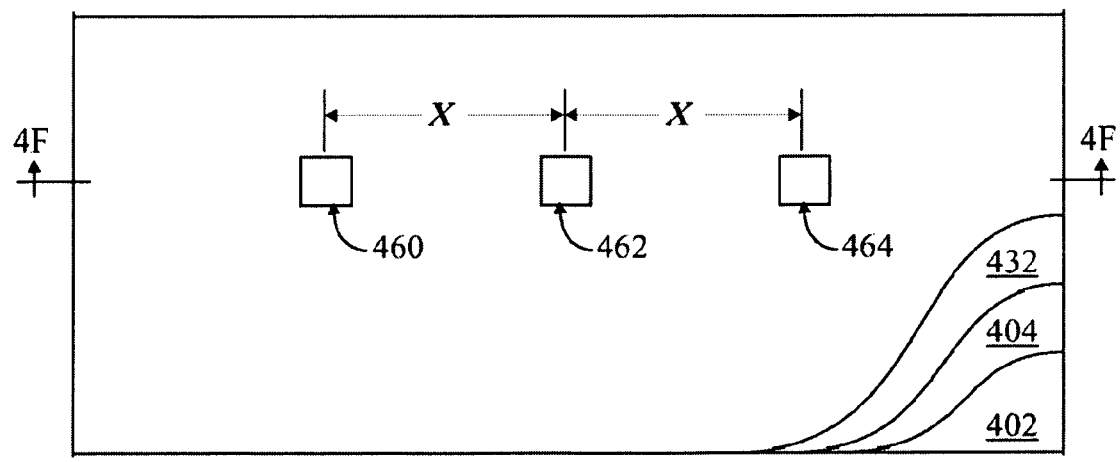
Figure 4F:
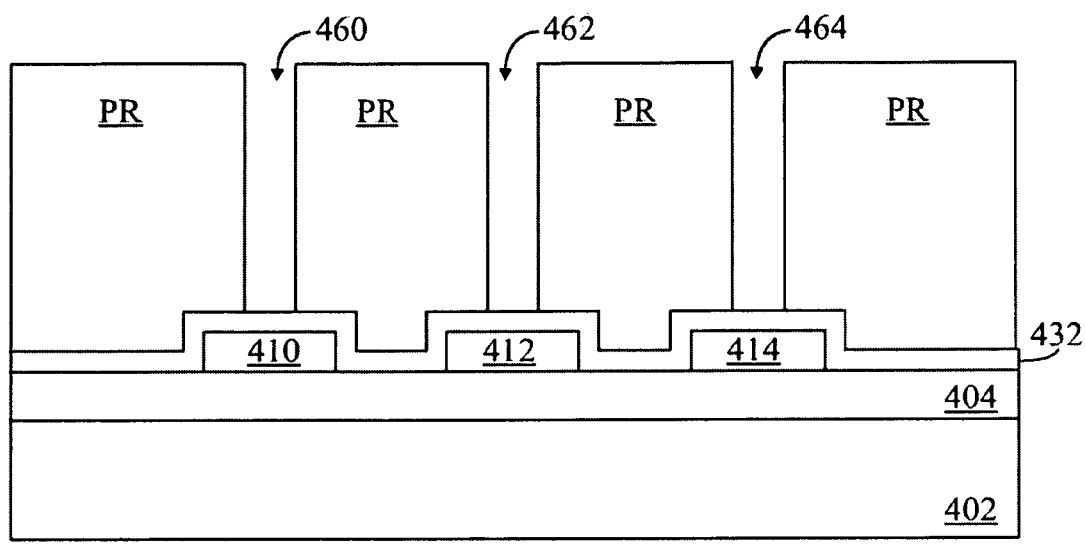
Figure 4G:
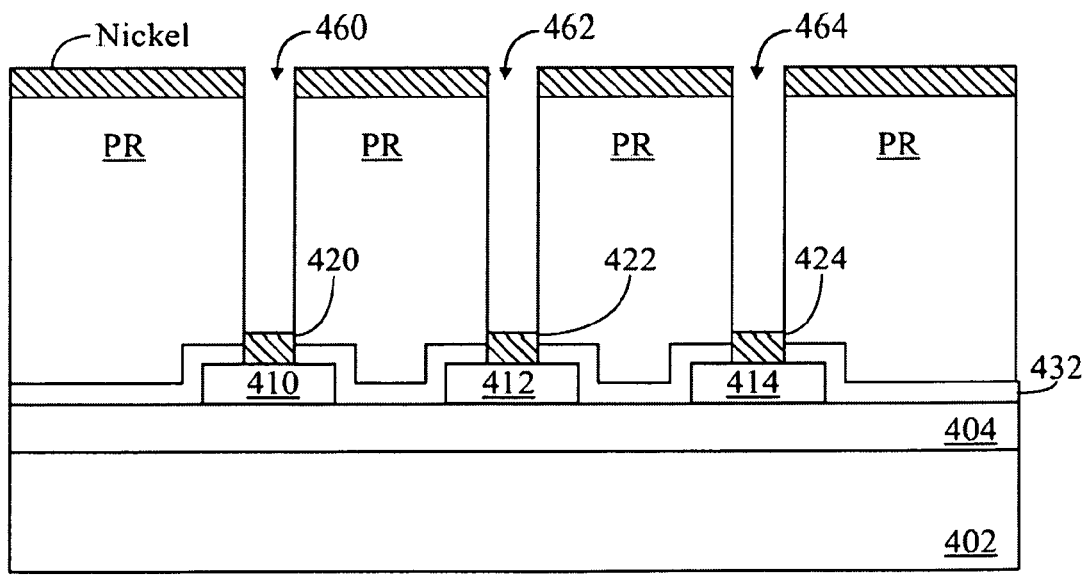
Figure 4H:
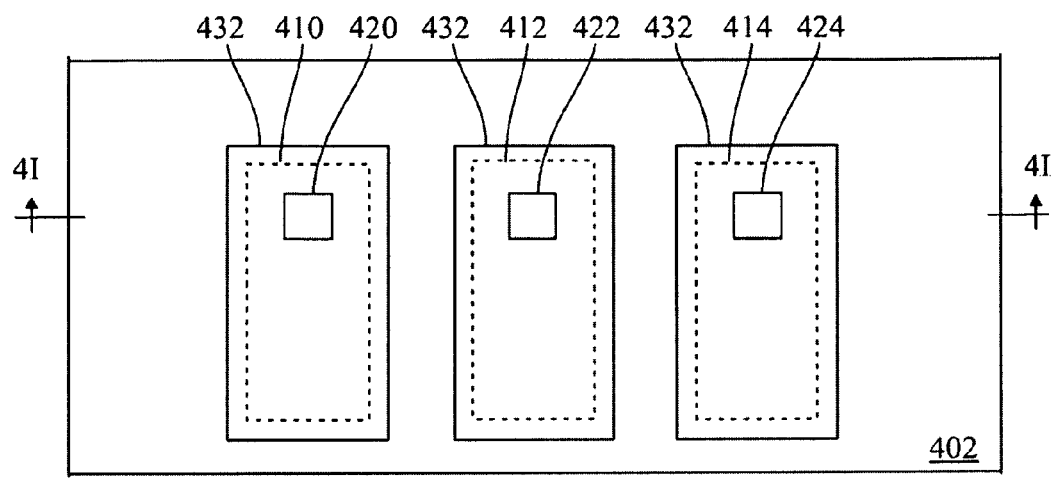
Figure 4I:
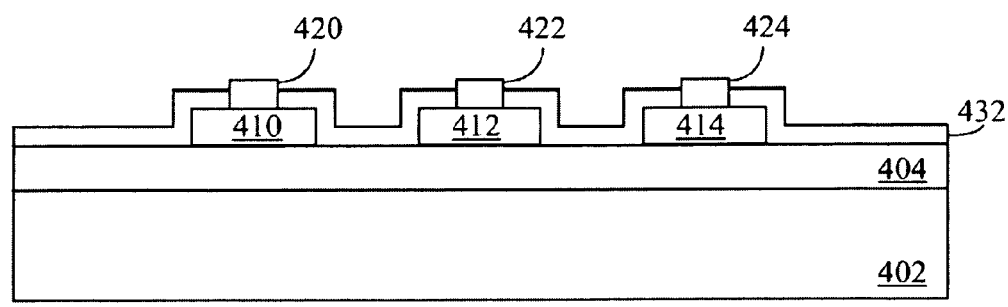
Figure 4J:
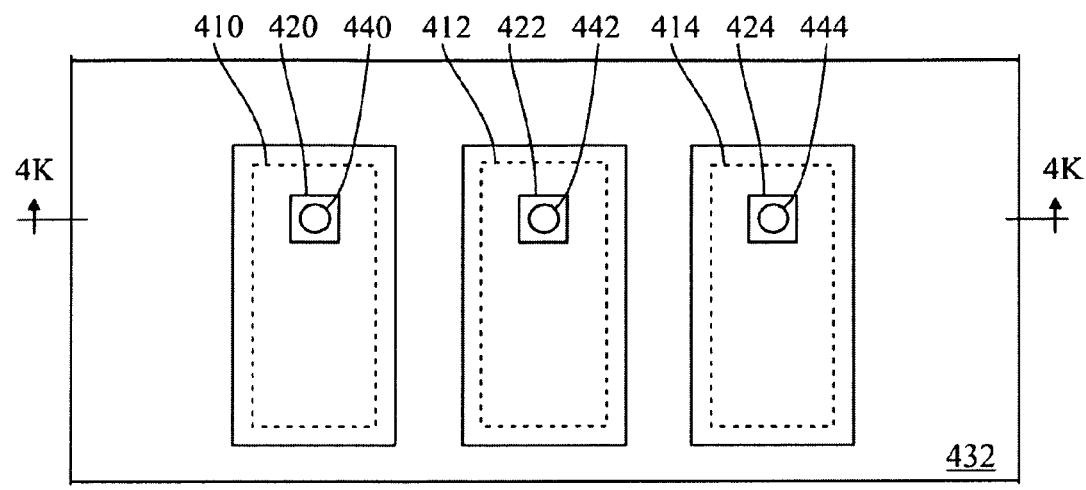
Figure 4K:
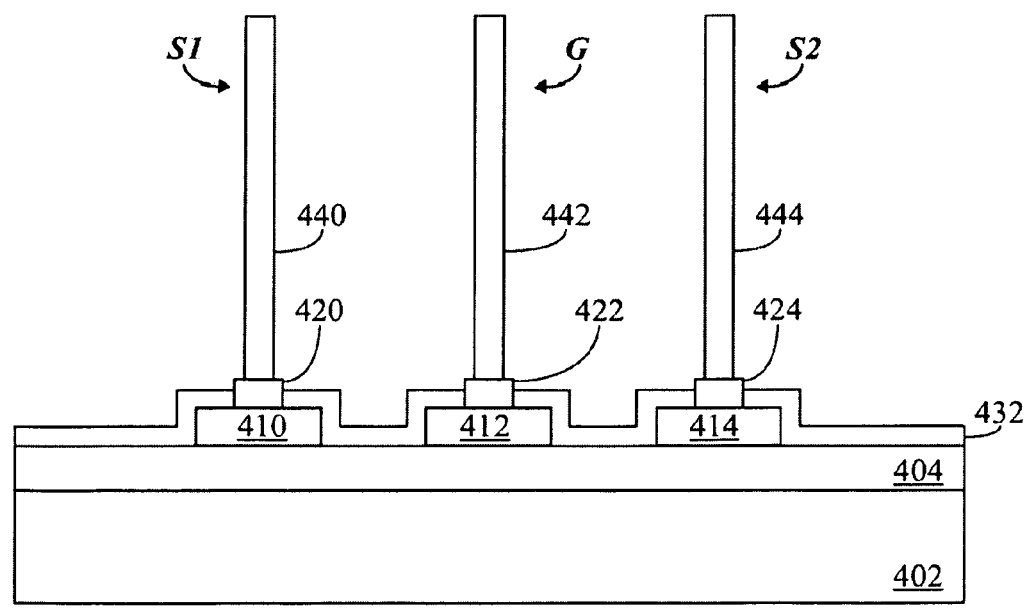
Figure 4L:
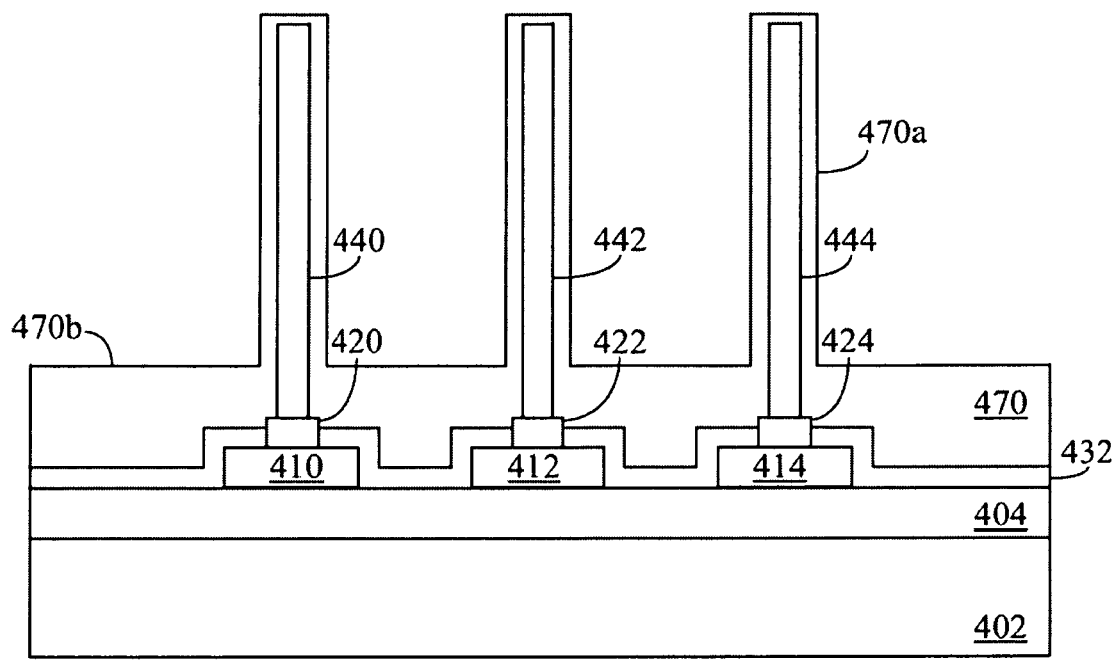
Figure 4M:
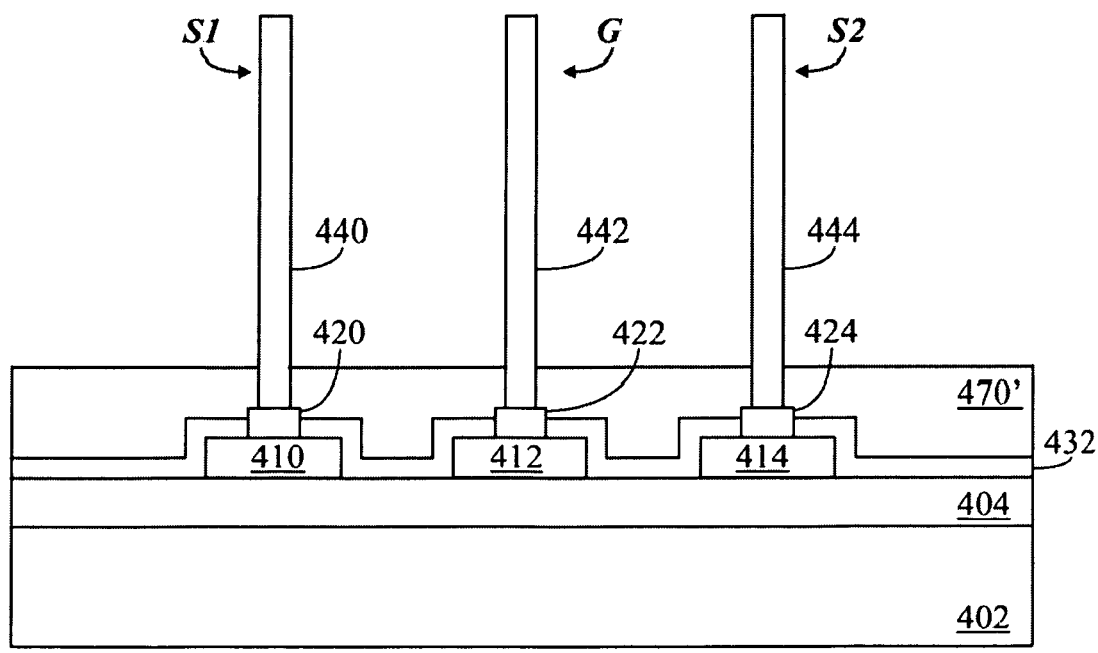
Figure 4N:
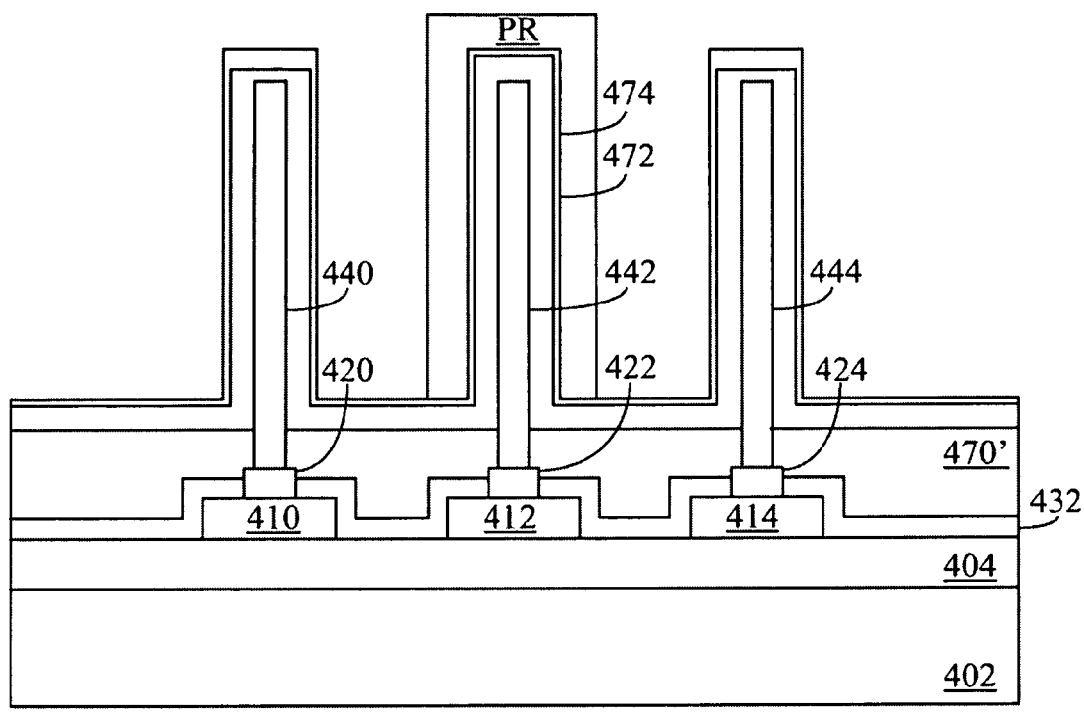
Figure 4O:
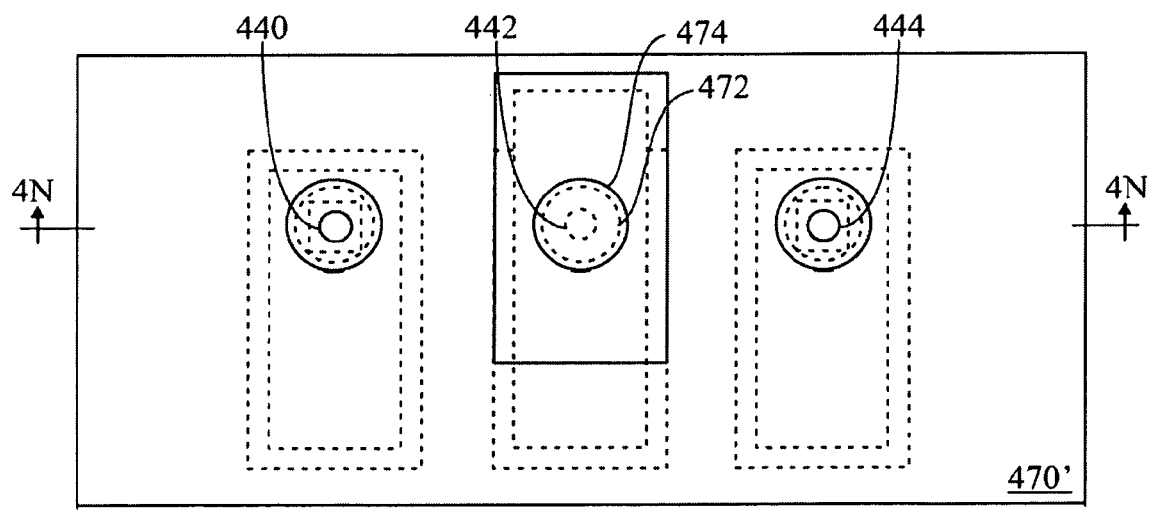
Figure 4P:
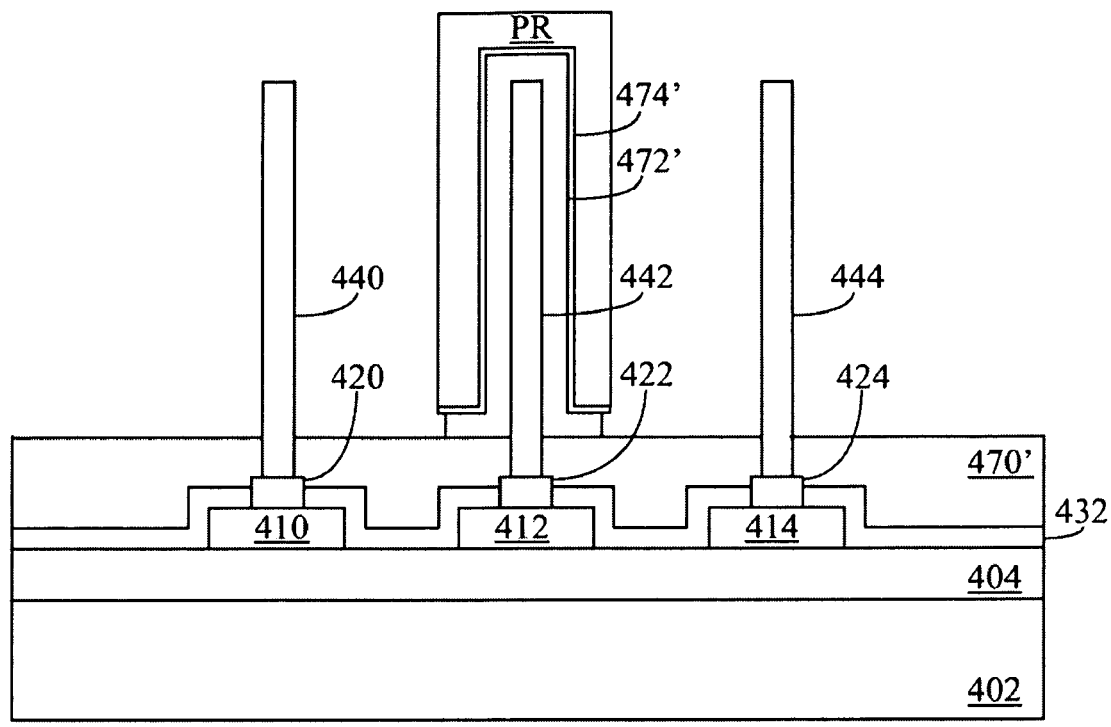
Figure 4Q:
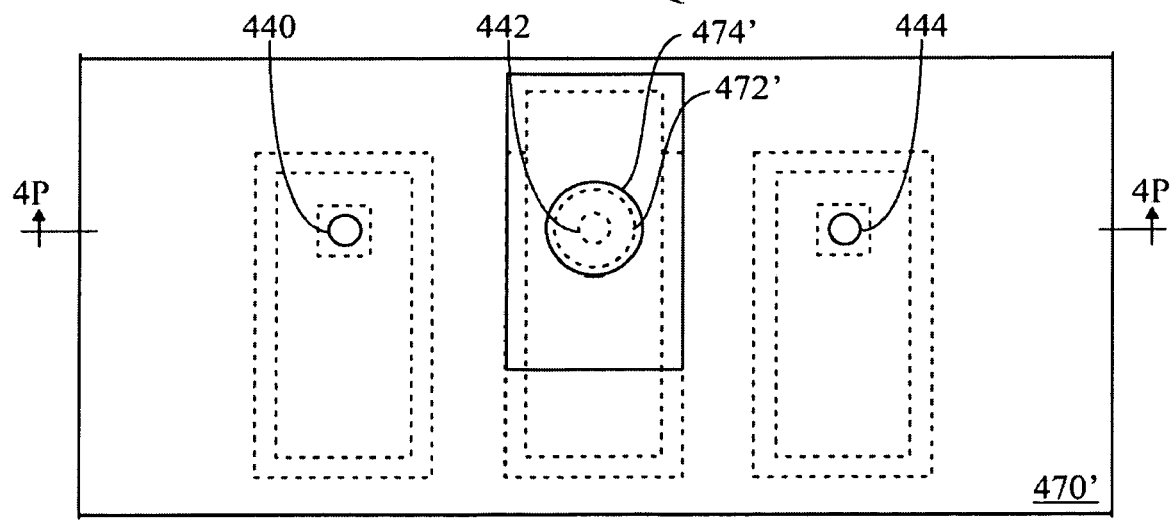

FIGS. 4A-4Q illustrate an exemplary process flow for making a NEM digital inverter 400, such as the NEM digital inverter 200 described hereinabove. FIG. 4A illustrates a first step (Step 1) in the overall process of making the NEM inverter. Starting with a wafer, or other substrate 402 (compare 202), an oxide layer 404 (compare 204) is deposited, using a conventional deposition process. The oxide layer 404 may have an exemplary thickness of 200-500 nm. Then a conductive layer 406 of titanium (Ti) or niobium (Nb) is deposited, using a conventional deposition process. The conductive layer 406 may have an exemplary thickness of 50-100 nm. Ti and Nb are chemically stable during subsequent processing. Other metals, such as aluminum (Al) and copper (Cu) may be used.

FIGS. 4B and 4C illustrate a next step (Step 2) in the overall process of making the NEM digital inverter. A layer of photoresist (PR) is deposited and is patterned, resulting in three masked areas. In FIG. 4B, the layer 406 is visible. Reactive Ion Etching (RIE) is performed, to form contacts 410, 412 and 414 (compare 210, 212, 214) from the conductive layer 406.

FIG. 4D illustrates a next step (Step 3) in the overall process of making the NEM digital inverter. The photoresist is removed, and a layer 432 (compare 232) of oxide is deposited, using a conventional deposition process, covering all exposed surfaces, which includes the contacts 410, 412 and 414, as well as exposed portions of the first oxide 404. This oxide layer 432 may have an exemplary thickness of 5-10 nm.

FIGS. 4E and 4F illustrate a next step (Step 4) in the overall process of making the NEM digital inverter. Another layer of photoresist (PR) is deposited and is patterned so as to have three openings 460, 462 and 464 extending down to the oxide layer 432. Each opening 460, 462 and 464 is aligned over a respective one of the contacts 410, 412 and 414. In FIG. 4E, the oxide 432, the oxide 404 and the underlying substrate 402 can be seen in the lower right corner ("cut" view) of the figure.

As best viewed in FIG. 4E, the openings 460, 462 and 464 in the photoresist (PR) may each be square, are substantially collinear with one another, and may be spaced a distance "X" apart from one another. An exemplary spacing "X" may be 20-200 nm. The openings may be circular, rather than square. Each opening may have a cross-dimension (or diameter) of approximately 10-100 nm.

The openings 460, 462 and 464 define positions for nanotubes (NEMs) which will be formed, in the following step(s).

FIG. 4G illustrates a next step (Step 5) in the overall process of making the NEM digital inverter. First, an etching process such as Reactive Ion Etching (RIE) is performed to remove portions of the oxide layer 432 at the bottoms of the openings 460, 462, and 464, exposing portions of the top surfaces of the contacts 410, 412 and 414, respectively. Then, nickel (Ni) is deposited, over the photoresist (PR) and into the openings 460, 462 and 464. The purpose of the nickel is to act as a "seed" for nanotube formation. The nickel may have a thickness of approximately 5-10 nm.

This results in nickel catalyst structures (also called "catalyst dots", or "seeds", or "seed structures", or the like) 420, 422 and 424 (compare 220, 222, 224) on the electrodes 410, 412 and 424, respectively. The nickel on top of the photoresist PR will be removed. Although the nickel seed structures 420, 422 and 424 are shown being smaller than the contacts 410, 412 and 414, they may be wider, for example as wide as the contacts (electrodes) upon which they are formed.

FIGS. 4H and 4I illustrate a next step (Step 6) in the overall process of making the NEM digital inverter. The photoresist (PR) is removed.

In FIG. 4H, the positions of the catalyst dots 420, 422 and 424 on the contacts 410, 412 and 414 can be seen. The contacts 410, 412 and 414 are shown in dashed lines. Also, the solid lines (rectangles) surrounding the contacts 410, 412 and 414 are simply edges of raised portions of the oxide 432 (see FIG. 4I). In FIG. 4I, the substrate 402 is indicated, for illustrative clarity, but compare the lower right corner in the cut view of FIG. 4E for a more accurate representation.

FIGS. 4J and 4K illustrate a next step (Step 7) in the overall process of making the NEM digital inverter. Carbon nanotubes (CNTs) 440, 442 and 444 (compare 220, 222, 224) are grown on the nickel catalyst dots 420, 422 and 424, respectively, using a conventional process, such as employing C2H2 and NH3 gas mixture. The CNTs may be single wall or multi-wall. These three CNT structures 440, 442 and 444 will become "S1", "G" and "S2", respectively, of the inverter.

The nanotubes (CNTs) 410, 412 and 414 are generally cylindrical, having a diameter of approximately 10-100 nm and a height of approximately 20-100 nm. Growth time for the CNTs 410, 412 and 414 may be controlled to determine the height of the CNTs. Alternatively, after growth of the CNTs, oxide could be deposited and a CMP step performed to ensure uniform height of the CNTs (after which, the oxide could be removed). Also note that although the diameter (cross-dimension) of the CNTs is shown smaller than the cross-dimension of seed structures 410, 412 and 414 upon which they are grown, they may be have a substantially similar cross-dimension.

In FIG. 4J, the overall oxide layer 432 is labeled (rather than the substrate 402), and the individual reference numerals at the raised rectangular edges of the oxide layer are omitted, for illustrative clarity.

FIG. 4L illustrates a next step (Step 8) in the overall process of making the NEM digital inverter. Nitride 470 is deposited, covering (coating) the CNT structures 440, 442 and 444 and the oxide layer 432. The deposition process may be high density deposition (HDP), resulting in a thin (horizontal, as viewed) portion 470a of the HDP nitride coating on the sidewalls of the CNT structures 440, 442 and 444, and a thicker (vertical as viewed) portion 470b of the HDP nitride coating on the oxide layer 432.

The thickness of the HDP nitride 470a on the sidewalls of the CNT structures may be 5-30 nm. The thickness of the HDP nitride 470b on the oxide layer may be 15-90 nm.

FIG. 4M illustrates a next step (Step 9) in the overall process of making the NEM digital inverter. The HDP nitride 470 is etched back, using a conventional etch process (such as wet etch), sufficient to remove the nitride 470a from the sidewalls (and top) of the CNT structures 440, 442 and 444. This will result in a commensurate thinning of the portion 470b of the nitride coating on the oxide layer 432. Hence, the HDP nitride layer is now labeled 470' (prime).

The purpose of the HDP nitride 470' is to provide support at the base of the CNT structures 440, 442 and 444. Since they are cantilever structures (elongate structures supported at only one end), and will be flexing (see FIGS. 3A and 3B), substantial mechanical forces can be generated at the point where the CNTs 440, 442 and 444 are attached to the catalyst dots 420, 422 and 424.

FIGS. 4N and 4O illustrate a next step (Step 10) in the overall process of making the NEM digital inverter. First, a layer of nitride 472 (compare 236) is deposited, over everything. The nitride layer 472 may have a thickness of approximately 20-50 nm. Next, a thin layer of chromium (Cr) 474 (compare 238) is deposited, over everything. The chromium layer 474 may have a thickness of approximately 1-5 nm. Next, the center CNT 442 is masked with photoresist (PR).

The nitride 472 functions as an insulator. The chromium 474 functions as a conductor. Other insulator and conductor materials may be used. As will become evident, the nitride 472 and chromium 474 also help to make the center CNT 442 stiff.

FIGS. 4P and 4Q illustrate a next step (Step 11) in the overall process of making the NEM digital inverter. The chromium 472 and nitride 474 are etched. This results in the left and right CNTs 440 and 444 being uncovered (again). The center CNT 442 remains covered with nitride 472' (prime) and chromium 474' (prime). Note, in FIG. 4P, the nitride 472' is shown slightly etched back (undercut) under the chromium 474', as a result of the nitride etch.

Figure 4R:
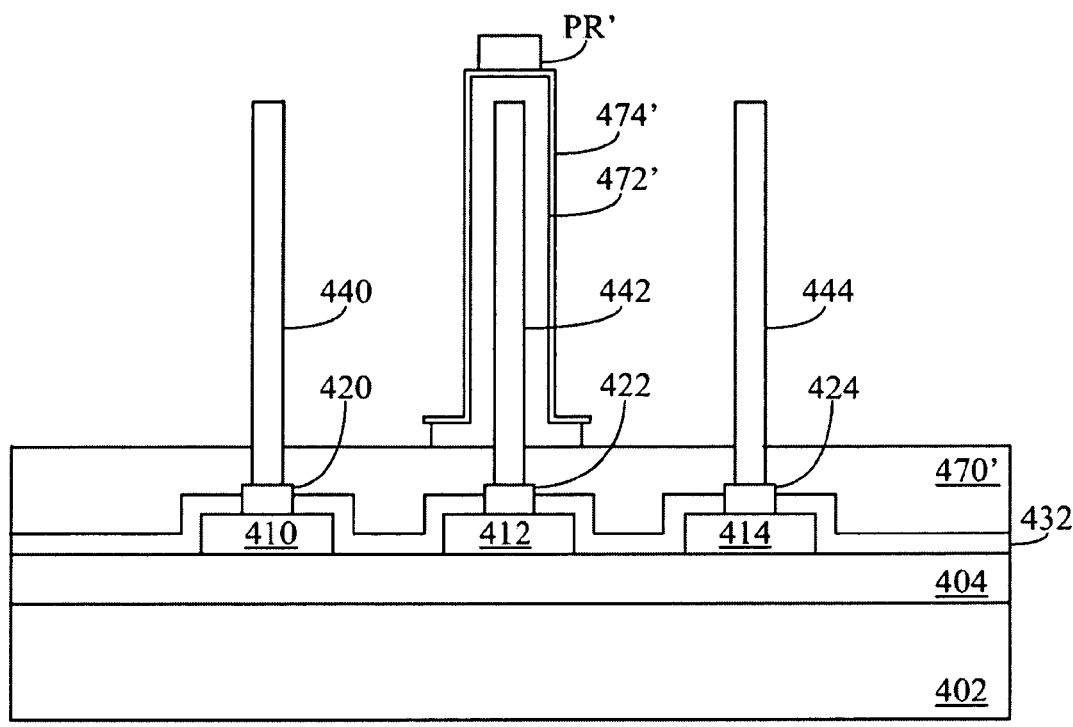
Figure 4S:
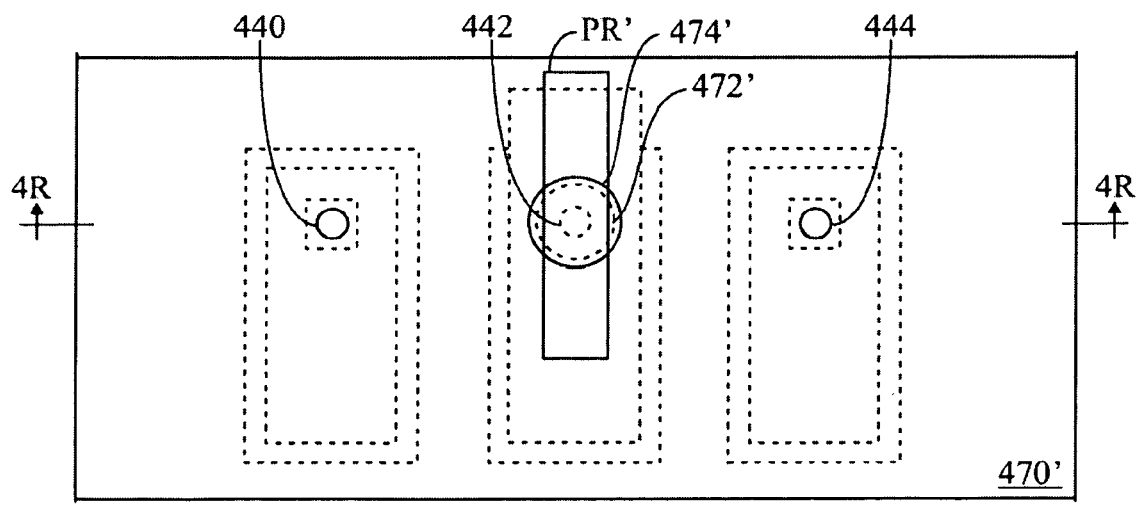

FIGS. 4R and 4S illustrate a next step (Step 12) in the overall process of making the NEM digital inverter. The photoresist PR is trimmed, resulting in a small island of photoresist PR' (prime) disposed (and centered) atop the chromium layer 474' on the center CNT 442. The overall width of the center CNT 442 with the nitride and chromium layers 472' and 474' may be approximately 30-100 nm. And, the width of the photoresist island PR' may be approximately 20-80 nm.

Figure 4T:
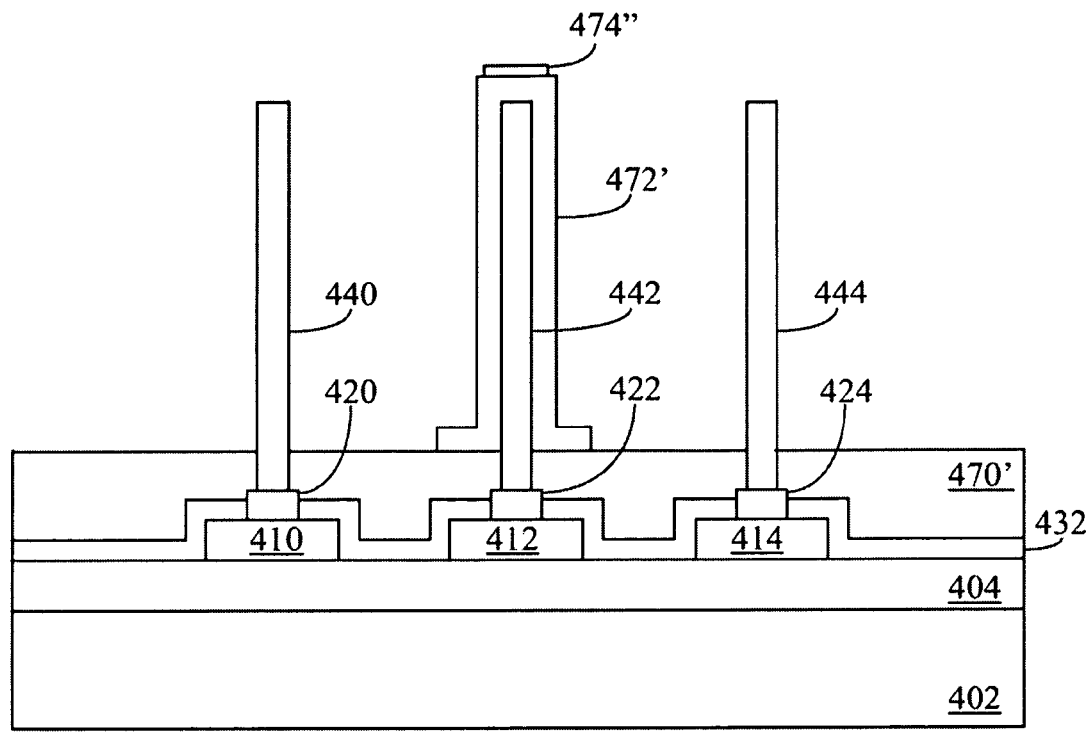
Figure 4U:
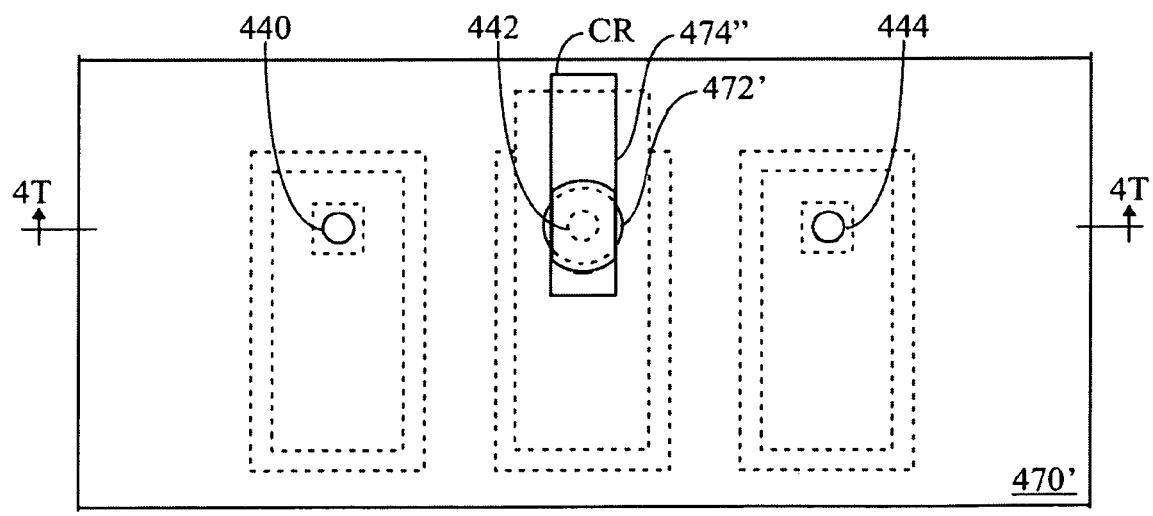

FIGS. 4T and 4U illustrate a next step (Step 13) in the overall process of making the NEM digital inverter. The chromium 474' is etched, and the photoresist PR' is removed, leaving only a small structure of chromium 474" (double prime) atop the nitride 472' on the center CNT 442.

The chromium 474", covering the top of 472' and partially covering the sidewall of 472', is formed by etching the Cr which is not covered by photoresist of PR' in FIG. 4S.

Opposite (left and right, as viewed in FIG. 4U) portions of the sidewall of the center CNT 442 which face the outer CNTs 440 and 444 are stripped of Cr, becoming exposed, for attracting S1 (440) and S2 (444).

Chromium 474" remains on opposite (top and bottom, as viewed in FIG. 4U) portions of the sidewall of the center CNT 442 which do not face the outer CNTs 440 and 444 to connect "spacers" (476, described hereinbelow, compare 238) disposed at the top of the center CNT 442 to the drain contact (the bottom of the CR plate).

Figure 4V:
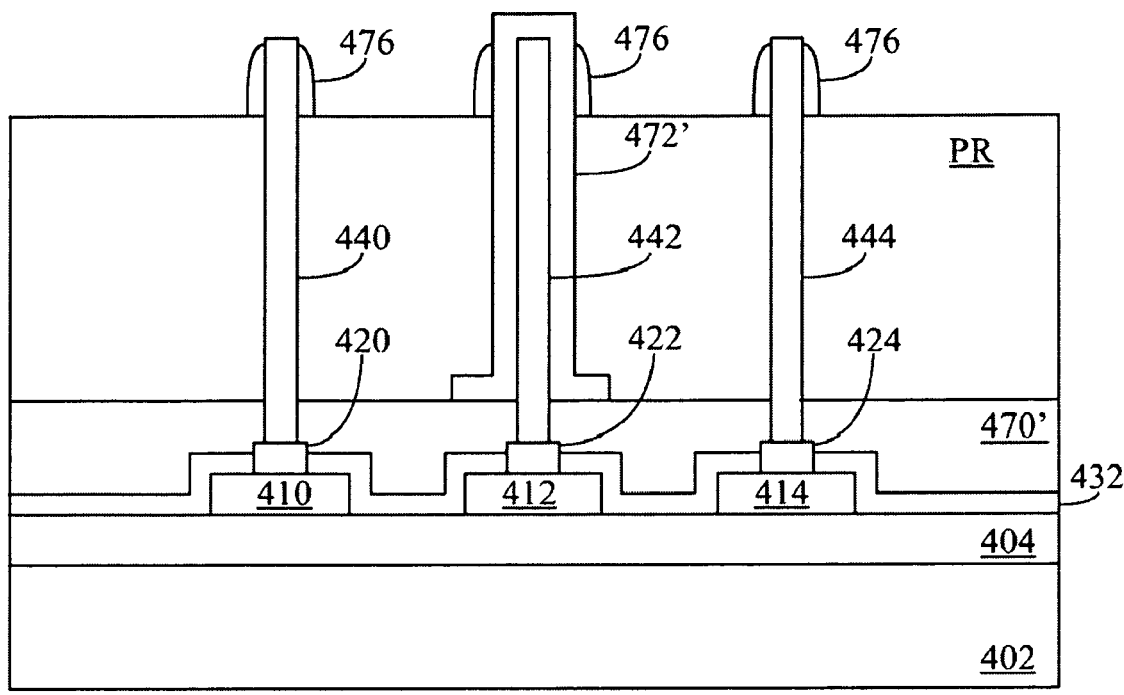

FIG. 4V illustrates a next step (Steps 14 and 15) in the overall process of making the NEM digital inverter. A layer of photoresist PR is applied to cover approximately the bottom ⅔ (two-thirds) of the CNTs 440, 442, 444.

For example the overall height "H" of the CNTs 440, 442 and 444 may be 90 nm, and the thickness of the photoresist PR may be 60 nm, leaving the top 30 nm of the CNTs 440, 442 and 444 exposed.

Then, a conductive material such as chromium 476 is deposited, such as to a thickness of 1-3 nm, and is RIE etched to form "spacers" (or contacts, comparable to contact points at the end of switch, or relay electrodes) on the top portions of the CNTs 440, 442, 444. These spacers 476 function as contact points between the drain and S1/S2 when S1/S2 is attracted to the drain by the gate electrical field. The RIE step removes the top part of the chromium 474". Compare 238, FIGS. 3A and 3B.

Figure 4W:
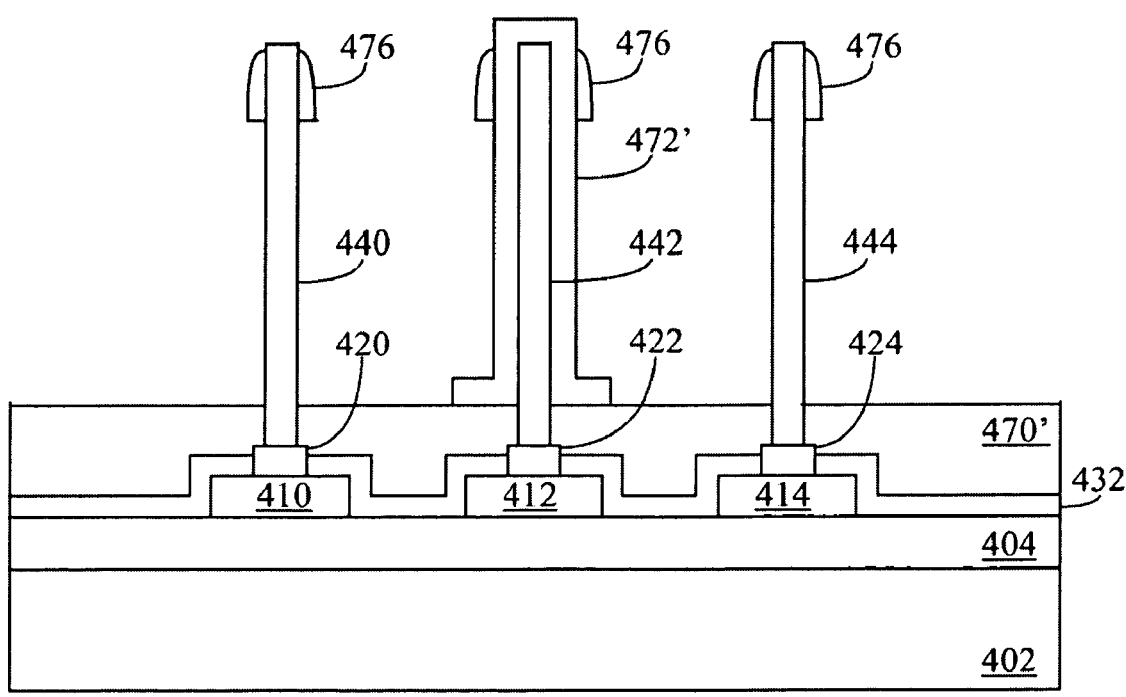

Then, the photoresist PR is stripped. See FIG. 4W.

Figure 4X:
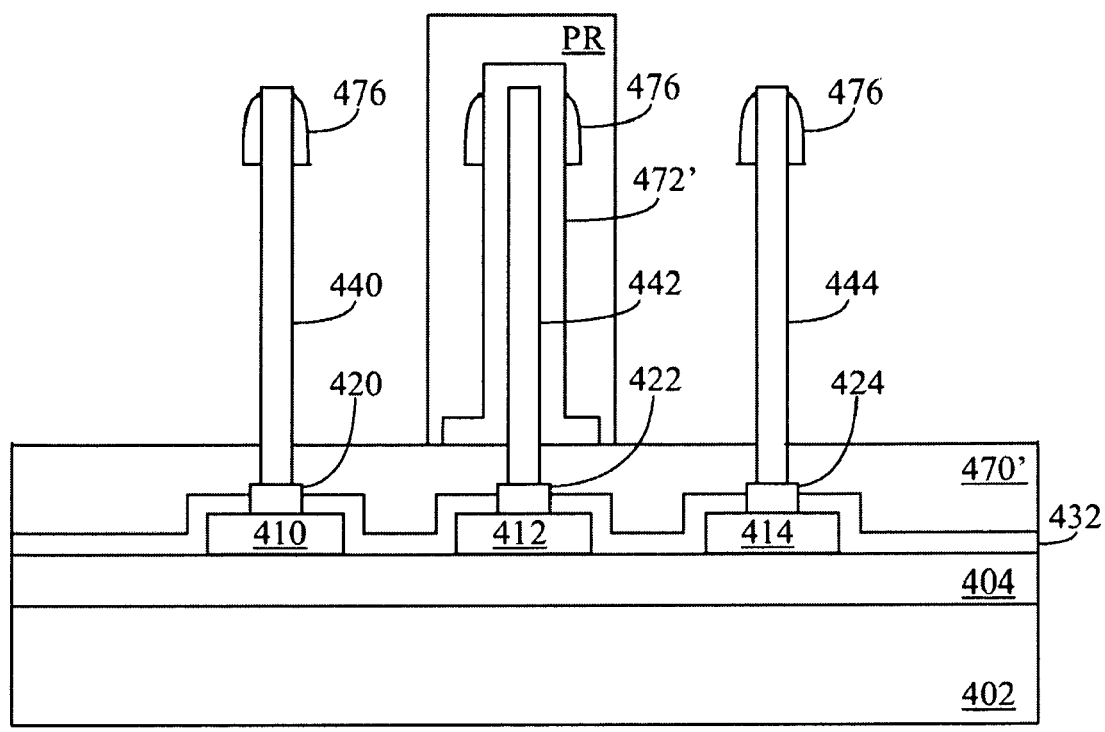

FIG. 4X illustrates a next step (Step 16) in the overall process of making the NEM digital inverter. Photoresist PR is applied to cover (mask) the center CNT 442.

Figure 4Y:
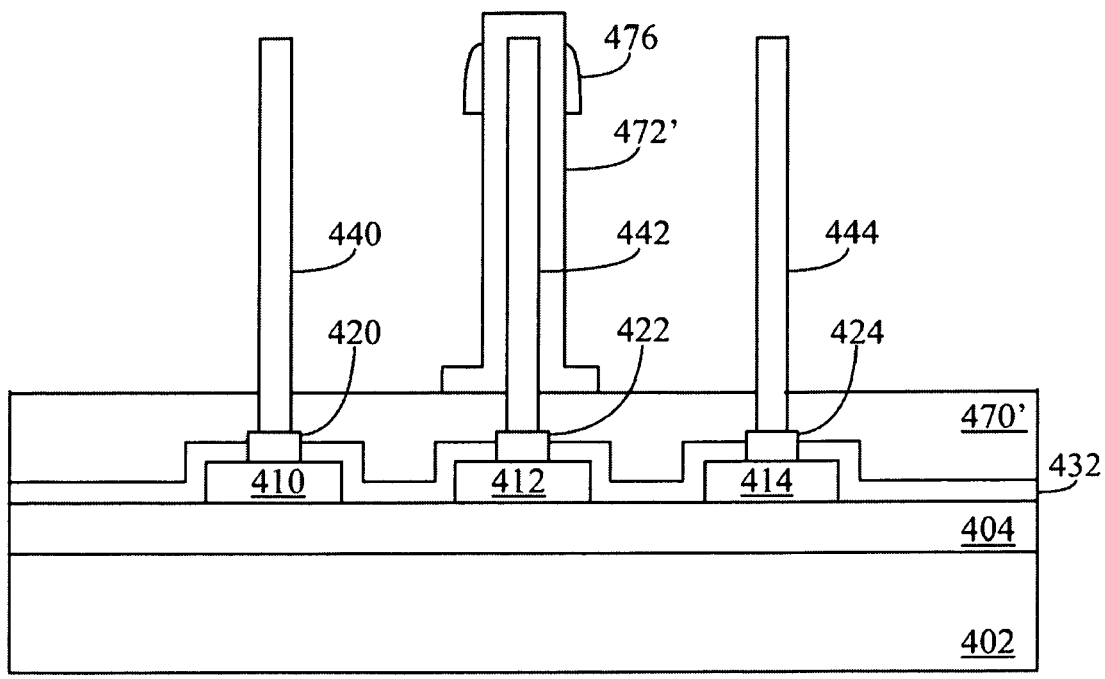
Figure 4Z:
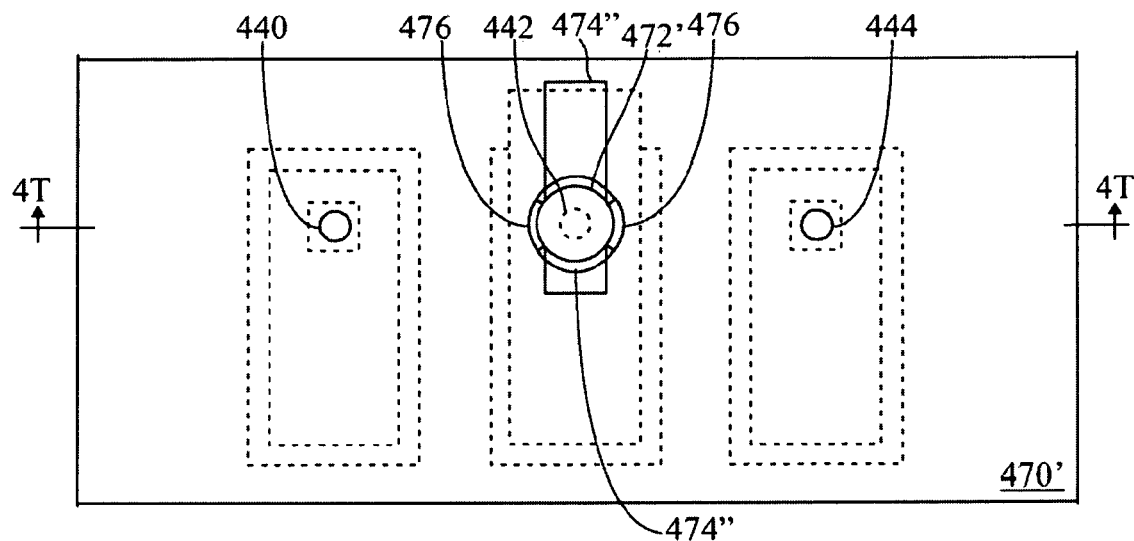
Figure 4A:
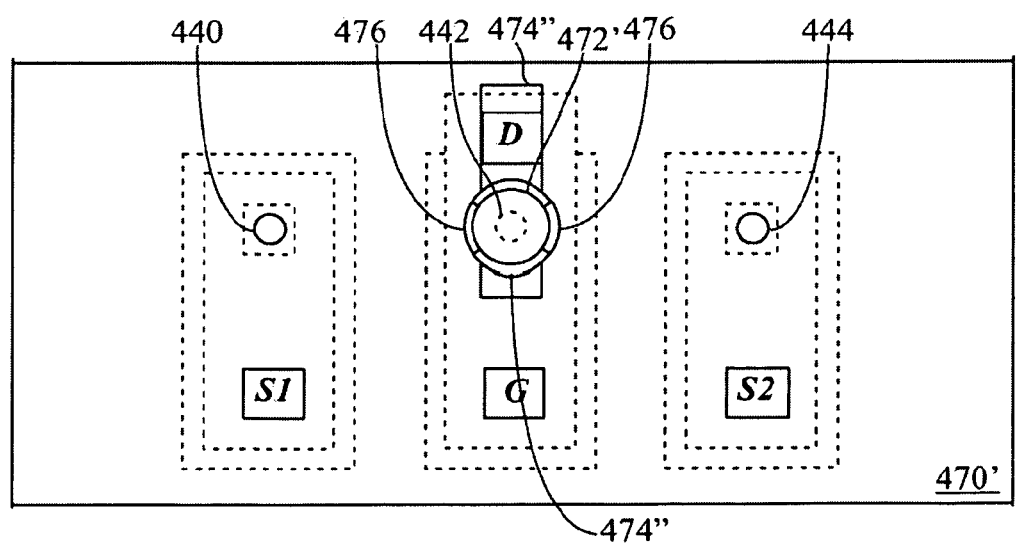

FIGS. 4Y and 4Z illustrate a next step (Step 17) in the overall process of making the NEM digital inverter. The chromium 476 is removed from the left and right CNTs 440 and 444, and the photoresist PR is removed. This leaves spacers (contacts) 476 only on the middle CNT 442.

The contacts 476 on the sides of the center CNT 442 facing the outer CNTs 440 and 444 are contiguous with the chromium 474" extending down the side of the center CNT 442 so that electricity can travel from the contacts 476 atop the gate (G) to the drain (D) of the inverter. The spacers on the back (top as viewed in FIG. Z) is thicker than the left or right spacers since there is CR layer before the spacers forms (Refer to FIG. 4U).

FIG. 4AA illustrates a next step (Step 18) in the overall process of making the NEM digital inverter. Contacts are formed, using conventional processes. The contacts are labeled as follows:

S1 for source-1 (logic 0), which is the CNT 440
G for gate (input), which is the CNT 442
D for drain (output), which is the chromium layer 474 on the CNT 442
S2 for source-2 (logic 1), which is the CNT 444

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A digital inverter comprising:
   a first carbon nanotube (CNT) extending from a substrate, and functioning as a first source (S1) for the digital inverter;
   a second carbon nanotube (CNT) extending from the substrate, and functioning as a second source (S2) for the digital inverter;
   a third carbon nanotube (CNT) extending from the substrate, and functioning as an input (G) of the digital inverter; and
   a conductive structure disposed on the third CNT, and functioning as an output (D) of the digital inverter when either the first CNT or the second CNT are in contact with the conductive structure disposed on the third CNT.

2. The digital inverter of claim 1, wherein:
   the first CNT is disposed at a first distance from the third CNT; and
   the second CNT is disposed at a second distance from the third CNT wherein said first and second distances are substantially the same.

3. The digital inverter of claim 2, wherein:
   the first and second CNTs are disposed on two sides of the third CNT.

4. The digital inverter of claim 1, wherein:
   the first, second, and third CNTs extend substantially vertically from the substrate.

5. The digital inverter of claim 1, further comprising:
   first, second, and third electrodes being disposed on a surface of the substrate,
   wherein the first, second and third CNTs extend from corresponding said first, second and third electrodes.

6. The digital inverter of claim 5, further comprising:
   first, second, and third catalyst structures being disposed on the first, second, and third electrodes respectively,
   wherein the first, second and third CNTs extend from corresponding said first, second and third catalyst structures.

7. The digital inverter of claim 1, wherein:
   the first, second and third CNTs have a height "H" of approximately 20-100 nm.

8. The digital inverter of claim 1, wherein:
   the first and second CNTs are sufficiently long to allow them to bend, and the third CNT (G) is sufficiently stiff to substantially prevent it from bending.

9. The digital inverter of claim 8, wherein:
   the first and second CNTs are selectively caused to bend and contact the third CNT (G).

10. The digital inverter of claim 1, wherein:
    in a first state, the first CNT deflects towards the third CNT and physically contacts the third CNT while the second CNT is isolated from the third CNT.

11. The digital inverter of claim 1, wherein:
    in a second state, the second CNT deflects towards the third CNT and physically contacts the third CNT while the first CNT is isolated from the third CNT.

12. The digital inverter of claim 1, wherein:
    said conductive structure is disposed near a top end of the third CNT (G).

13. A method of for inverting a digital signal comprising:
providing a nanoelectromechanical digital inverter comprising first, second, and third elongated carbon nanotubes (CNTs) extending from a surface of a substrate;
providing a drain (d) for the digital inverter;
applying a first digital logic source signal to the first CNT which functions as a first source (S1) for of the digital inverter;
applying a second digital logic source signal to the second CNT which functions as a second source (S2) for of the digital inverter;
using the third CNT as a gate (G) for the digital inverter; and
applying a third digital logic signal to the gate (G) causing one of the first and second CNTs to deflect towards the third CNT and physically contact the third CNT whereby the drain outputs one of the first and second digital logic source signals which is the inverse of the third digital logic signal.

14. The method of claim 13, further comprising:
disposing a conductive contact structure near a top end of the third CNT whereby:
when the first CNT deflects towards the third CNT, the first CNT physically contacts the conductive contact structure of the third CNT; and
when the second CNT deflects towards the third CNT, the second CNT physically contacts the conductive contact structure of the third CNT.

15. The method of claim 13, including:
selecting the first and the second digital logic source signals to have a voltage difference ranging from 0.5 to 15 volts.

16. The method of claim 13, including:
providing first and second CNTs that are sufficiently long to allow them to deflect; and
providing a sufficiently stiff third CNT (G) to substantially prevent it from deflecting.

17. The method of claim 16, including:
disposing the first CNT at a first distance from the third CNT; and
disposing the second CNT at a second distance from the third CNT wherein said first and second distances are substantially the same.

18. The method of claim 17, including:
disposing the first and second CNTs on two sides of the third CNT.

19. The digital inverter of claim 17, including:
disposing first, second, and third electrodes on a surface of a substrate; and
extending the first, second and third CNTs from corresponding said first, second and third electrodes.

20. The digital inverter of claim 19, including:
extending the first, second, and third CNTs substantially vertically from the substrate.

* * * * *